United States Patent
Yano et al.

[11] Patent Number: 5,633,207
[45] Date of Patent: May 27, 1997

[54] METHOD OF FORMING A WIRING LAYER FOR A SEMICONDUCTOR DEVICE

[75] Inventors: Hiroyuki Yano, Wappingers Falls; Katsuya Okumura, Poughkeepsie, both of N.Y.

[73] Assignee: Kabushiki Kaisha Toshiba, Kawasaki, Japan

[21] Appl. No.: 321,897

[22] Filed: Oct. 14, 1994

[51] Int. Cl.[6] .............. H01L 21/465; B44L 1/22; C03C 15/00; C23F 1/00
[52] U.S. Cl. .................... 438/645; 438/633; 438/675; 438/654
[58] Field of Search .............. 156/636.1, 645.1; 437/228, 228 ES, 228 POL

[56] References Cited

U.S. PATENT DOCUMENTS

| | | | |
|---|---|---|---|
| 3,571,919 | 3/1971 | Gleim et al. | 437/228 |
| 4,053,350 | 10/1977 | Olsen et al. | 156/659 |
| 4,426,767 | 1/1984 | Swanson et al. | 29/571 |
| 5,017,509 | 5/1991 | Tuckerman et al. | 437/182 |
| 5,094,972 | 3/1992 | Pierce et al. | 437/67 |
| 5,102,498 | 4/1992 | Itoh et al. | 156/659 |
| 5,114,875 | 5/1992 | Baker et al. | 437/228 |
| 5,185,293 | 2/1993 | Franke et al. | 437/184 |
| 5,240,554 | 8/1993 | Hori et al. | 156/643 |
| 5,246,884 | 9/1993 | Jaso et al. | 437/225 |
| 5,272,117 | 12/1993 | Roth et al. | 437/228 |
| 5,292,682 | 3/1994 | Stevens et al. | 437/53 |
| 5,300,188 | 4/1994 | Tessmer et al. | 437/228 |
| 5,332,467 | 7/1994 | Sune et al. | 437/225 |
| 5,445,996 | 8/1995 | Kodera et al. | 437/225 |

*Primary Examiner*—Helane Myers
*Assistant Examiner*—J. Pasterczyk
*Attorney, Agent, or Firm*—Banner & Witcoff, Ltd.

[57] ABSTRACT

A method of forming a wiring layer for a semiconductor device forms a first layer on a dielectric film on a substrate to protect integrated circuit devices from overpolishing when a wiring layer is formed on a second layer above the polish stop layer. The wiring layer is deposited using selective chemical vapor deposition to prevent contamination of the wafer.

10 Claims, 3 Drawing Sheets

METHOD OF FORMING A WIRING LAYER FOR A SEMICONDUCTOR DEVICE

FIELD OF INVENTION

The invention generally relates to a method of manufacturing a semiconductor device and, more particularly, to a method of forming a wiring layer for a semiconductor device.

BACKGROUND OF INVENTION

A conventional method of manufacturing a semiconductor device where a wiring layer is formed is described with reference to FIGS. 1A–1H. In FIG. 1A, a dielectric film 12 such as silicon dioxide (SiO$_2$) is deposited on a silicon substrate 11 (i.e., a wafer) containing an underlying integrated circuit device (not shown). The surface of the deposited dielectric film may have dents 13 due to, for example, previous processing and/or underlying structures as shown in FIG. 1A.

A photosensitive resin layer is then formed on dielectric film 12. Thereafter, the photoresist is aligned and exposed with a desired wiring pattern. The photoresist undergoes a development process to form a photoresist pattern 14 as shown in FIG. 1B. Dielectric film 12 is selectively etched using a reactive ion etching (RIE) method with the photoresist pattern 14 serving as a mask. The resulting structure is shown in FIG. 1C. Following the etching, the photoresist pattern 14 is removed, thereby leaving the structure shown in FIG. 1D.

Next, a titanium nitride (TiN) film 15 is deposited on dielectric film 12 producing the structure shown in FIG. 1E. Using a blanket chemical vapor deposition (CVD) method, a tungsten film 16 is then deposited on TiN film 15 producing the structure shown in FIG. 1F. TiN film 15 acts as a seed layer and an adhesion layer for the deposition of the tungsten film.

Thereafter, the tungsten film 16 and the TiN film 15 are polished. Since the polishing rates of TiN film 15 and tungsten film 16 are generally much greater than the polishing rate of dielectric film 12, it would be expected that dielectric film 12 would function as a polish stop. However, in practice if dielectric film 12 is exposed, tungsten film 16 becomes overpolished, thereby causing dishing. Further, the load or down force of the polishing pad tends to become concentrated on the surface of dielectric film 12 so as to result in a surface topography as shown in FIG. 1G. As a result, the wiring layer becomes thinner, thereby adversely affecting the performance and reliability of the semiconductor device. An increase in wiring resistance results (sheet resistance) when thinning occurs. For example, when the aforementioned conventional method was applied, wiring resistance (i.e., sheet resistance) varied from 0.8 ohm/sq to 2.3 ohm/sq. although a desired wiring resistance ranged from 0.7 ohm/sq to 0.9 ohm/sq. Moreover, the exposure of conductive layers under the TiN film 15 can result in undesirable electrical short circuits.

If the layer of material is underpolished, then the layer of material will likely be insufficiently planarized or remain too thick. Consequently, subsequent electrical contact processing may not completely remove portions of the layer of material resulting in the formation of undesirable electrical open circuits.

Even assuming that there is sufficient selectivity between the polishing rates of tungsten and dielectric film 12 (e.g., SiO$_2$), other problems can result. As shown in FIG. 1H, dents 13 are located on the surface of dielectric film 12. If polishing stops on the surface of dielectric film 12, the TiN and/or the tungsten remains not only in grooves that become wiring, but also in dents 13. When metal (e.g., tungsten and TiN) is present in the dents 13, short circuits can result. For example, in devices manufactured according to the above method, the short yield was 77% for a 0.3 μm line and 0.3 μm space pattern.

Problems with the conventional method are not only limited to the polishing process. The blanket CVD method for depositing tungsten film 16 on TiN film 15 also has several disadvantages. For example, a tungsten film tends to grow on the wall of the CVD chamber as tungsten film 16 is deposited on the wafer. Growth of the tungsten film on the wall of a CVD chamber can prevent tungsten from evenly growing from the bottom of the trench. In addition, the rate of deposition using a blanket deposition method is generally slow and it is difficult to fill narrow trenches or through holes (e.g., contacts, vias) due to the occurrence of voids and shims. Further, the tungsten film deposited on the wall of the chamber can peel off causing the wafer to be contaminated.

SUMMARY OF THE INVENTION

The present invention overcomes the disadvantages associated with the aforementioned method of forming a wiring layer in a semiconductor device. For example, the present invention reduces the possibility of open and short circuits thereby improving the open and short yields of interconnection following planarization. Further, the stability of the manufacturing process and the performance and reliability of the semiconductor device are enhanced. For instance, shims, seams, and voids which are often present in layers are substantially eliminated.

A method of forming a wiring layer for a semiconductor device on a substrate includes the steps of forming a dielectric film on the substrate, forming a first layer on the dielectric film, and selectively etching the first layer and the dielectric film to form a trench. Also, the method includes forming a second layer on the dielectric film and the first layer. Further, the method includes the steps of polishing the second layer using the first layer as a polish stop, selectively depositing a conductive layer on the second layer, but not on the first layer, polishing the conductive layer using the first layer as a polish stop, and removing the first layer.

According to an exemplary embodiment of the present invention, the conductive layer is tungsten, the second layer is titanium nitride, and the first layer is carbon. An O$_2$ ashing method may be used to remove the first layer.

BRIEF DESCRIPTION OF THE DRAWINGS

The present invention will now be described in more detail with reference to preferred embodiments of the invention, given only by way of example, and illustrated in the accompanying drawings in which.

DETAILED DESCRIPTION

The present invention is discussed below with reference to manufacturing a semiconductor device with a tungsten metal wiring layer. However, the present invention may be applied to manufacturing semiconductor devices with other typical types of wiring layers including, among others, copper and nitride layers.

A method for forming a metal wiring layer will be described with reference to FIGS. 2A–2N described below. Metal wiring layers formed as described below can be used for many purposes including serving as bit line wiring, word line wiring, contact wiring, etc.

Figure 1A:
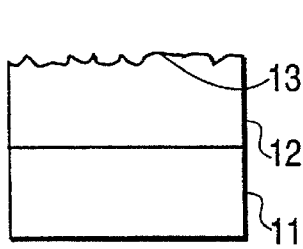
FIGS. 1A–1H show the various stages according to a conventional method of forming a wiring layer in the manufacturing process associated with a semiconductor device.
Figure 1B:
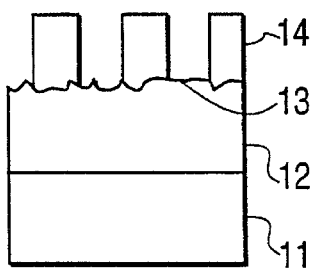
Figure 1C:
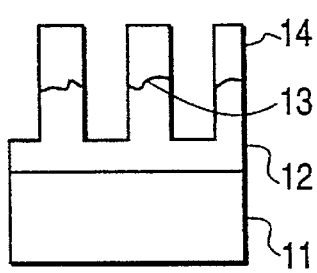
Figure 1D:
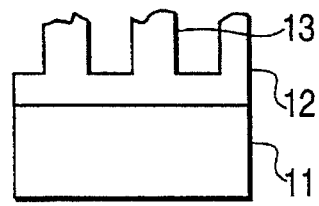
Figure 1E:
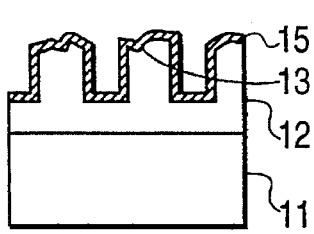
Figure 1F:
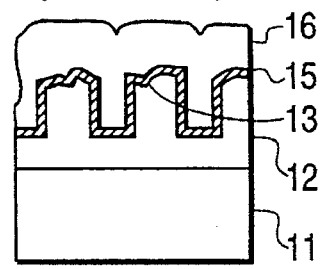
Figure 1G:
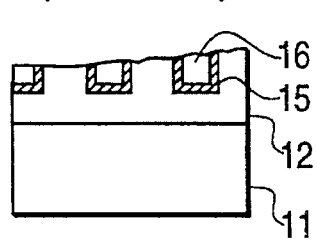
Figure 1H:
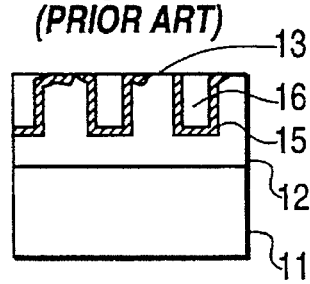
Figure 2A:
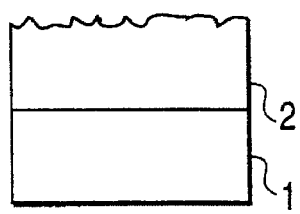
FIGS. 2A–2J show the various stages according to the method of the present invention of forming a wiring layer in a semiconductor device.

In FIG. 2A, a dielectric film 2 such as $SiO_2$ is deposited on a silicon substrate 1 (i.e., a wafer) having a thickness of, for example, 4000 Å. A device layer (not shown) is formed on substrate 1 prior to deposition of dielectric film 2. Integrated circuits are formed on the surface of the device layer. The dielectric film 2 may have dents 3 as shown in FIG. 2A due to previous processing or underlying structures.

Figure 2B:
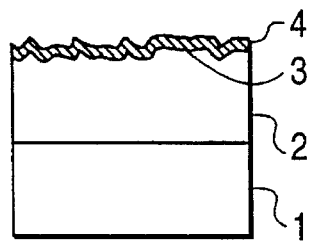
Figure 2C:
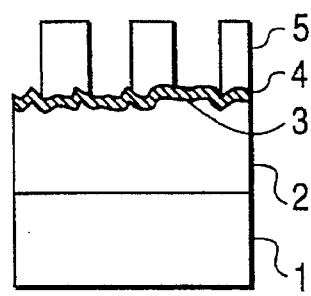

After depositing dielectric film 2 on substrate 1, carbon film 4 having a thickness of approximately 80 nanometers is deposited on dielectric film 2 as shown in FIG. 2B. Next a photoresist (i.e., a photosensitive resin layer) 5 is formed on carbon film 4. The photoresist is aligned and exposed with a desired wiring pattern and undergoes a development process to form a photoresist pattern 5 as shown in FIG. 2C. The carbon film 4 serves as an anti-reflection film so that the resist pattern is substantially free from the influence of reflection by the underlying film or substrate.

Figure 2D:
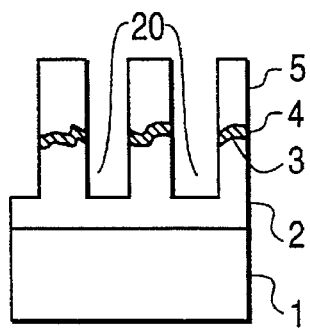
Figure 2E:
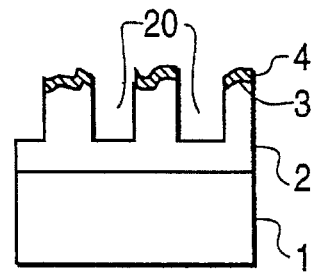

Following formation of photoresist pattern 5, carbon film 4 and dielectric film 2 are selectively etched to form trenches 20 using, for example the RIE method, with photoresist pattern 5 serving as a mask resulting in a structure as shown in FIG. 2D. The depth of trenches 20 is approximately 220 nanometers. In the next step, photoresist pattern 5 is removed using a chemical dry etch method (CDE) leaving the structure shown in FIG. 2E. Alternatively, a mixed solution of $H_2SO_4$ and $H_2O_2$ can be employed to selectively remove photoresist pattern 5 without removing carbon film 4. It is to be understood that the aforementioned patterning process is for illustrative purposes only and that other patterning processes can be used to achieve the same structure.

Figure 2F:
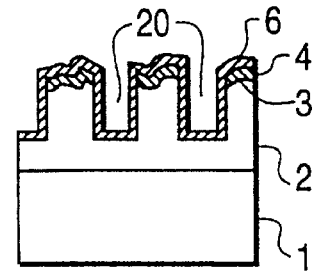

A TiN film 6 having a thickness of approximately 40 nanometers is then deposited on carbon film 4 producing the structure depicted in FIG. 2F. TiN film 6 acts as an adhesion and seed layer for the subsequent deposition of tungsten as described below.

Figure 2G:
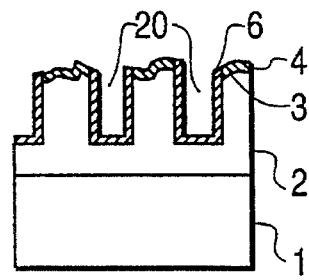

Next, the TiN film 6 is polished using the chemical mechanical polishing (CMP) method. The polishing rate of carbon is less than 5 the polishing rate of TiN. In an illustrative example, with the various aforementioned parameters, when TiN film 6 was polished using CMP, the polishing rate was found to be 25 nanometers/minute while the polishing rate of the carbon film 4 was substantially slower at 0.5 nanometers/minute. The etch selectivity (i.e., the polishing rate of TiN film 6 divided by the polishing rate of carbon film 4) was 50. With a selectivity of 50, carbon removal was not observed. Thus, the polishing operation does not result in any significant removal of carbon film 4 as shown in FIG. 2G.

Figure 2H:
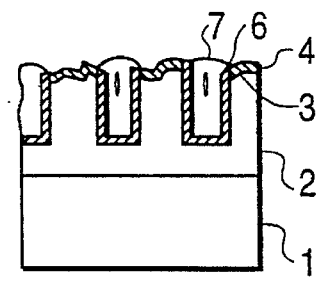

After CMP, a tungsten film 7 is deposited on TiN film 6 by selective chemical vapor deposition (CVD). Tungsten film 7 does not grow on carbon film 4, thus the structure shown in FIG. 2H results. Employing the selective CVD method minimizes the amount of tungsten film growth on the wall of the CVD chamber and substantially eliminates contamination of the wafer resulting from tungsten peeling off of the wall of the chamber.

Figure 2I:
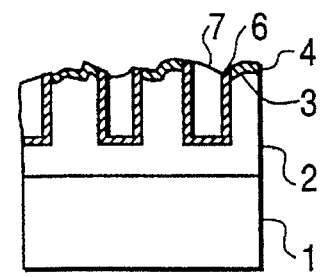

Next, tungsten film 7 is polished using a CMP process. The polishing rate of tungsten is substantially greater than the polishing rate of carbon. Consequently, carbon film 4 acts as a polish stop layer and protects dielectric film 2 from overpolishing and the structure shown in FIG. 2I results. It is to be understood that other materials, such as $Al_2O_3$, SiC, etc., can be employed, as long as the polishing rate of the material being used is sufficiently slow in the existing CMP condition.

According to an illustrative embodiment with the aforementioned parameters, the polishing rate of tungsten film 7 was 300 nanometers/minute, the polishing rate of carbon film 4 was 0.5 nanometers/minute, and the polishing rate of the $SiO_2$ dielectric film 2 was 3 nanometers/minute. No overpolishing was observed with the films having the aforementioned polishing rates. Although this step is not strictly necessary since tungsten is not generally deposited on carbon film 4, the CMP process aids in making the surface of tungsten film 7 flatter and removes tungsten which unexpectedly grows on carbon film 4.

Figure 2J:
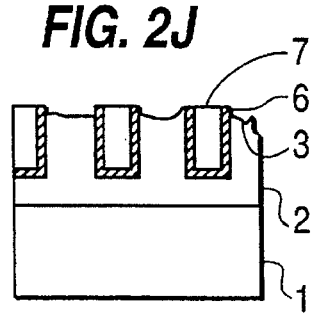

Next, carbon film 4 is removed by a conventional $O_2$ ashing method. Ashing substantially removes all metal (TiN and/or tungsten) from dents 3, resulting in the structure of FIG. 2J. In the illustrative embodiment, TiN and/or tungsten were not observed in dents 3. In devices manufactured according to the above-described method, the short yield was 98% for a 0.3 μm line and 0.3 μm space pattern. The resistivity varied from 0.7 ohm/sq to 1.0 ohm/sq.

The short yield was improved for several reasons. First, the underlying dielectric (e.g., oxide) film was covered with carbon film which prevented the dents on the dielectric film from causing shorts. Further, by using selective CVD, contamination which forms on the wafer from tungsten on the chamber wall that can cause short failure was reduced.

Figure 3A:
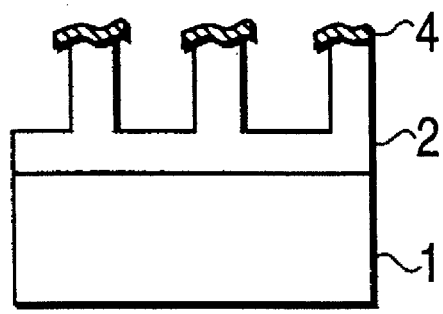
FIGS. 3A–3D show various alternatives to the method of the present invention.
Figure 3B:
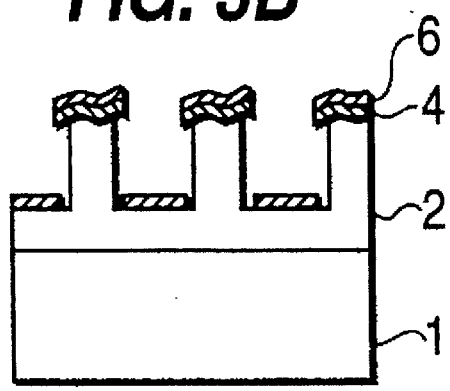

Several alternatives can be employed with the foregoing method. For example, according to another embodiment the dielectric film (e.g., an oxide) 2 can be etched isotropically (i.e., etching the photoresist downward and to the side) after performing RIE. Thus, following the formation of the structure in FIGS. 2D or 2E, the structure depicted in FIG. 3A results. Next, a TiN film 6' can be deposited using a collimated sputtering deposition method realizing the structure shown in FIG. 3B. TiN film 6' only appears at the bottom of the trenches and not on the sidewalls.

Figure 3C:
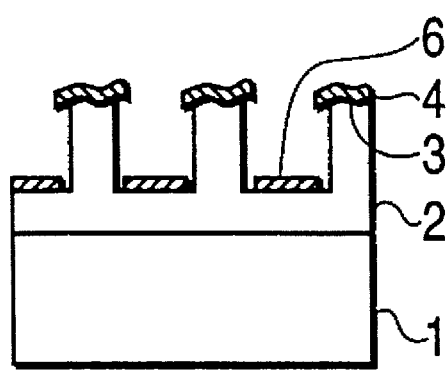
Figure 3D:
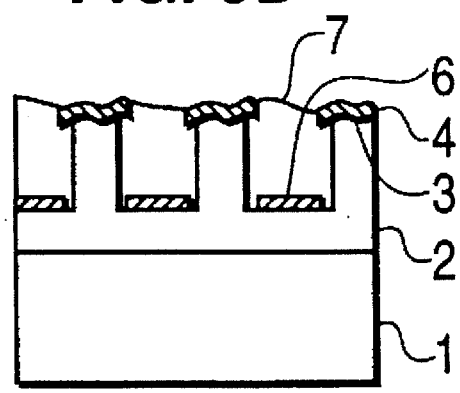

Next, TiN film 6' is polished as described above with respect to FIG. 2G leaving the structure depicted in FIG. 3C. Subsequently, a tungsten film 7' is deposited on TiN film 6' resulting in the structure of FIG. 3D. Tungsten film 7' does not grow on the side walls of the trenches, but only on the bottom. Accordingly, the potential for shims, voids, and seams in the trenches is substantially eliminated. Following tungsten deposition, tungsten film 7' is polished and carbon film 4 is removed in the manner described above resulting in respective structures analogous to those depicted in FIGS. 2I and 2J.

While particular embodiments of the present invention have been described and illustrated, it should be understood that the invention is not limited thereto since modifications may be made by persons skilled in the art. The present application contemplates any and all modifications that fall within the spirit and scope of the underlying invention disclosed and claimed herein.

What is claimed is:

1. A method of forming a wiring layer on a substrate for a semiconductor device, said method comprising the steps of:

forming a dielectric film on said substrate;

forming a first layer on said dielectric film;

selectively etching said first layer and said dielectric film to form a trench ending in said dielectric film;

forming a second layer on said dielectric film and said first layer wherein the hardness of said second layer is less than the hardness of said first layer;

polishing said second layer using said first layer as a polish stop;

selectively depositing a conductive layer on said second layer, but not on said first layer;

polishing said conductive layer using said first layer as a polish stop; and removing said first layer.

2. The method according to claim 1 wherein said conductive layer is tungsten.

3. The method according to claim 1 wherein said second layer is titanium nitride.

4. The method according to claim 1 wherein said step of selectively etching includes isotropically etching.

5. The method according to claim 4 wherein said step of forming said second layer includes collimated sputtering.

6. The method according to claim 1 wherein said first layer is carbon.

7. The method according to claim 6 wherein said step of removing said first layer includes $O_2$ ashing.

8. The method according to claim 1 wherein said step of selectively etching includes the steps of:

forming a mask on said first layer;

etching said first layer and said dielectric film; and removing said mask from said first layer.

9. The method according to claim 8 wherein said step of removing said mask includes using a chemical dry etch method.

10. The method according to claim 8 wherein said mask is a photoresist and said first layer serves as an anti-reflection film.

* * * * *